United States Patent [19]
Hirochi et al.

[11] Patent Number: 4,877,677
[45] Date of Patent: Oct. 31, 1989

[54] WEAR-PROTECTED DEVICE

[75] Inventors: Kumiko Hirochi, Moriguchi; Makoto Kitabatake, Katano; Osamu Yamazaki, Toyonaka, all of Japan

[73] Assignee: Matsushita Electric Industrial Co., Ltd., Kadoma, Japan

[21] Appl. No.: 830,085

[22] Filed: Feb. 18, 1986

[30] Foreign Application Priority Data

Feb. 19, 1985 [JP] Japan .................. 60-30907
Apr. 18, 1985 [JP] Japan .................. 60-82850
Jul. 4, 1985 [JP] Japan .................. 60-147943
Sep. 12, 1985 [JP] Japan .................. 60-200475

[51] Int. Cl.⁴ .......................... B32B 9/00; G11B 5/72
[52] U.S. Cl. .................... 428/216; 428/408; 428/522; 428/699; 428/908.8; 428/457; 428/426; 427/42; 427/122
[58] Field of Search ............ 428/408, 216, 699, 908.8, 428/457, 426; 427/42, 122

[56] References Cited

U.S. PATENT DOCUMENTS

| Re. 32,464 | 7/1987 | Aine | 428/694 X |
| 3,964,937 | 6/1976 | Post et al. | 428/699 |
| 4,035,541 | 7/1977 | Smith et al. | 428/699 |
| 4,177,370 | 12/1979 | Steeves | 427/42 |
| 4,290,075 | 9/1981 | Jacobs et al. | 428/699 |
| 4,309,483 | 1/1982 | Gravert | 427/122 |
| 4,403,015 | 9/1983 | Nakai | 428/699 |
| 4,581,116 | 4/1986 | Plowman et al. | 427/42 |
| 4,647,494 | 3/1987 | Meyerson et al. | 428/408 X |
| 4,698,256 | 10/1987 | Giglia et al. | 428/408 X |

FOREIGN PATENT DOCUMENTS

| 59-247945 | 11/1984 | Japan . | |
| 0258727 | 12/1985 | Japan | 428/328 |
| 1206919 | 9/1986 | Japan | 428/694 |

Primary Examiner—P. C. Ives
Attorney, Agent, or Firm—Cushman, Darby & Cushman

[57] ABSTRACT

A hard carbon film (12) is formed by ion-beam sputtering on a surface of a substrate (11) such as glass lens or metal sheet of a magnetic disk or a plastic film of a magnetic video tape, by selecting the direction of the ion-beam in the sputtering process to be parallel with surface of the substrate (11) of a magnetic disk, and subsequently theroen a lubricative film (13), such as $ZnS_2$ is formed also by ion-beam sputtering.

19 Claims, 3 Drawing Sheets

WEAR-PROTECTED DEVICE

BACKGROUND OF THE INVENTION

1. FIELD OF THE INVENTION

The present invention relates generally to a wear-protected device having a surface of high hardness, high resistivity against abrasion and low friction coefficient.

2. DESCRIPTION OF THE RELATED ART

Hitherto, as the wear-protective film, compounds of carbon such as SiC, compounds of nitrogen such as TiN, compounds of oxygen as hard coating, or waxes, high polymer compounds of fluorine, compounds of sulfur or compounds of halogen as lubricant of very low friction have been used.

These conventional arts are disclosed in the published unexamined Japanese Patent Application Sho No. 59-93869, U.S. periodical "Thin Solid Films", pages 203-216, No. 122, 1984 and pages 109-121, No. 120, 1984, and the U.S. patent application Ser. No. 716,133.

These wear-protected films do not have sufficient hardness, and accordingly, a film having such a high abrasion-resistivity close to diamond, of low cost, of easy forming, of long life, of low friction and of high smoothness has long been demanded. On the other hand, since a film of high hardness generally has low bonding force on a substrate, and therefore is liable to easy peeling off, and accordingly a film of large bonding force has been demanded. Furthermore, a wear-protected film having a high transparency and is effective even when applied with a very small thickness has been demanded.

SUMMARY OF THE INVENTION

The present invention purposes to provide a wear-protected device or a lubricative and hard film of carbon film, which has a high surface hardness, small friction coefficient and a high abrasion resistivity even with small thickness, and has a long life time.

In order to achieve the above-mentioned object, a wear-protected device in accordance with the present invention has a hard film containing at least carbon on at least a surface to receive physical action, and thereon a lubricative film which has a smaller friction coefficient than that of the hard carbon film. In another embodiment of the present invention, on at least a surface to receive a physical action of a substrate, a hard film containing at least carbon is applied with a buffer film which has good bonding force both to the substrate and the hard film.

The above-mentioned wear-protected device is made by disposing a substrate in a direction substantially parallel with direction of an ion-beam which irradiates a carbon target, in an ion-beam sputtering apparatus, and then carrying out the ion-beam irradiation on said carbon target, to form a hard carbon film on the substrate.

DESCRIPTION OF THE PREFERRED EMBODIMENT

Figure 1:
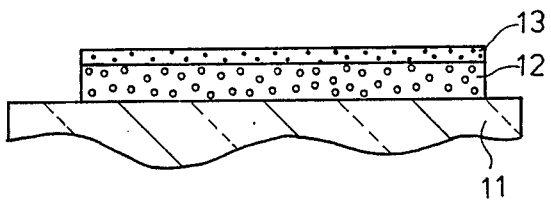
FIG. 1 is a sectional view showing a first embodiment of wear-protected device in accordance with the present invention.

As shown in FIG. 1, on a surface to receive physical action of a substrate, such as a glass lens, a metal sheet of a hard magnetic disk or a plastic film of a magnetic video tape, etc., a hard carbon film 12 is provided by an ion-beam sputtering process. Then, on the surface of the carbon hard film 12, a lubricative film 13 which has a smaller friction coefficient than that of the carbon hard film 12 is provided in order to protect the surface of the substrate 11 to receive the physical action permanently from abrasion due to the physical action, such as mechanical friction by a magnetic head. For a solid state lubricative film, when such film as having the friction coefficient of less than 0.3 is used, sufficient effect is obtainable.

As the lubricative film 13, when a film which contains at least carbon is used, but the hydrogen concentration thereof is equal or smaller than that of the hard carbon film 12, the lubricative film has a stronger bonding force to the hard carbon film 12. Besides the above-mentioned lubricative film consisting substantially of carbon, any of the following substances is suitable as the lubricative film 13: a compound of sulfur, such as $ZrS_2$, $VS_2$, $MoS_2$, $WS_2$ or $PeS_2$, a compound of selenium, such as $WSe_2$, $MoSe_3$ or $NbSe_2$, a compound of tellurium, a compound of fluorine, such as $(CF_x)_n$, a compound of halogen, such as $CdCl_2$ or $CdI_2$, a compound of nitrogen, such as BN, an oxide such as mica, or graphite; and any optimum substance can be selected from the viewpoint of kind or kinds of physical action which the lubricative film receives. For instance, in case the device is to be used in a high moisture atmosphere, graphite or the like is suitable. By selecting the thickness of the carbon hard film 12 to be less than 500 Å, effect to the substrate can be minimized and the bonding force on the substrate becomes large and stable. Even when the thickness of the lubricative film 13 is selected to be less than 500 Å, the effect of the lubrication is sufficient, and in some case the lubrication effect is more than the case where the lubricative film is more than 500 Å. For instance, when on a magnetic film as the substrate a hard carbon film 12 of 200 Å thickness is formed, and further thereon a lubricative film 13 of 100 Å is coated, even though they are on a flexible substrate, the device operates stable enough without mechanical damage, and no adverse effect on the magnetic characteristic is observed.

Figure 2:
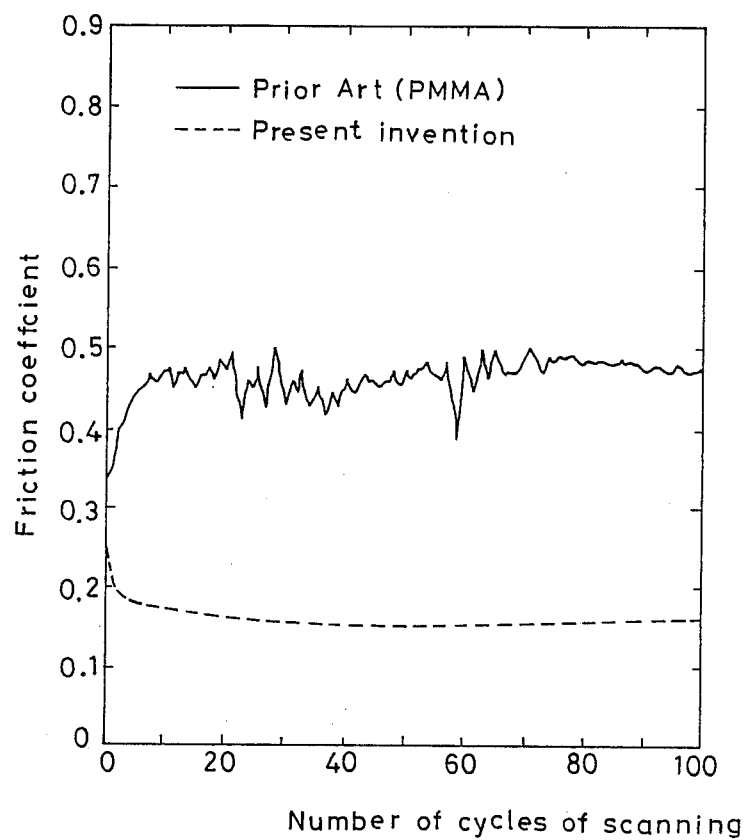
FIG. 2 is a graph comparatively showing time change of friction coefficients of a preferred embodiment of the wear-protected device in accordance with the present invention and a conventional device without wear-protection measure.

FIG. 2 shows time change of friction coefficient measured at repeated impressions of a 10 g weight, scanning at a speed of 1.00 mm/sec on a wear-protected device, which is made by using polymethylacrylate (PMMA) resin as the substrate, and thereon a hard carbon film 12 of about 300 Å is formed, and further thereon, as the lubricative film 13 a film containing at least carbon and wherein the hydrogen component is smaller than that of the hard carbon film 12 is formed to a thickness of about 200 Å. According to the present invention, even by using a PMMA resin film which has relatively low softening point, a wear-protected device having sufficient abrasion resistance and low friction coefficient is obtainable. By embodying the present invention, the friction coefficient becomes less than half that of the conventional device without the lubricative film, and such a low friction coefficient as about 0.16 is obtainable and a satisfactorily long life time of $10^3$ passes at more than 10 g weight, compared with the conventional life time of about 150 pass of the conventional film applied with silicone abrasion resistive agent, is obtainable; and this result is sufficient for practical use. This mode of embodiment is specially effective in the case when the substrate surface is much scanned directly by a repeatingly sliding member.

Figure 3:
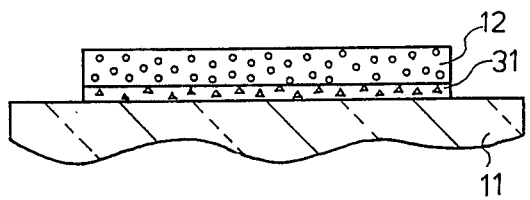
FIG. 3 is a sectional view showing a second embodiment of wear-protected device in accordance with the present invention.

A second embodiment of the present invention is shown in FIG. 3. On at least a surface to receive physical action such as pressing force, friction force, etc., a hard carbon film 11 is formed with providing a buffer film 31 between the substrate 11 and the hard carbon film 12. Therefore, the bonding force between the hard carbon film 12 and the substrate 11 is increased, and made stable. By using a film which contains at least carbon and wherein the hydrogen component is equal to or less than the hard carbon film as the buffer film 21, there is a possibility of further increasing the bonding force onto the substrate 11. By selecting the thickness of the buffer film 21 to be less than 500 Å, sufficient and stable bonding of the hard carbon film 12 on the substrate is achieved, and the high hardness surface is bonded more stably with respect to external pressing force, and strain in the film is minimized. Furthermore, by selecting the thickness of the hard carbon film 12 to be less than 500 Å, the hard carbon film 12 can be freely bent on the substrate 11, hence the hard carbon film 12 becomes stable against handling of the wear-protected device. For instance, when surface protection of a plastic lens is made by embodying the present invention, as a result of stably bonding a high hardness thin film, such as hard carbon film, on a low hardness substrate, such as a plastic lens, a wear-protected device having sufficient strength and long life against scratch damage or a like defect, is obtainable on top of the low friction characteristic.

Figure 4A:
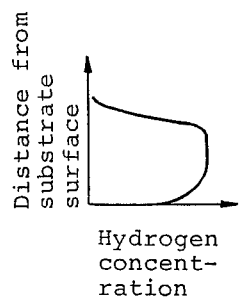
FIG. 4A is a graph showing change of hydrogen concentration with respect to distance from the surface of the substrate.
Figure 4:
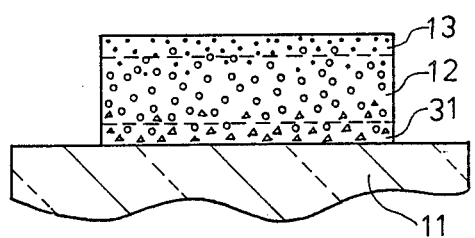
FIG. 4 is a sectional view of a third embodiment of wear-protected device in accordance with the present invention.

A third embodiment of the present invention is shown in FIG. 4, wherein on at least a surface to receive a physical action of the substrate, a buffer layer 31 comprising at least carbon and hydrogen is formed in a manner that hydrogen component distribution changes, gradually increasing, to that of the hard carbon film 12. When a lubricative film 13 is formed on the surface of the hard carbon film 12, the hydrogen component distribution thereof is gradually decreased from a component equal to that on the surface of the hard carbon film 12 down to a low component of the surface of the lubricative layer 13. By providing the sloped distribution of the hydrogen component, a strong and stable bonding force and a splended lubricative character are given to wear-protected device. The lubricative layer 13 may be such other lubricative material as a compound of sulfur, such as $ZrS_2$, $VS_2$, $MoS_2$, $WS_2$, or $PeS_2$, a compound of selenium, such as $WSe_2$, $MoSe_3$ or $NbSe_2$, a compound of tellurium, a compound of fluorine, such as $(CF_x)_n$, a compound of nitrogen, such as BN, an oxide such as mica, or graphite.

Figure 5:
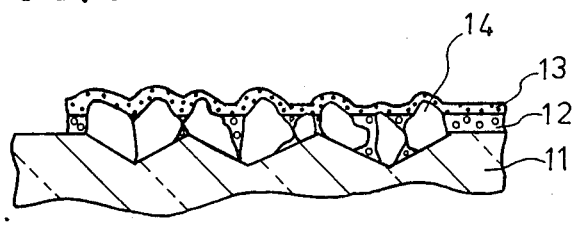
FIG. 5 is an enlarged sectional view showing the surface state of the wear-protected device of the present invention.

An actual example of wear-protected device embodying the present invention is shown in FIG. 5. On a rough surface of a substrate 11, which has unevenness of about 1000 Å, a hard carbon film 12 containing diamond granules of about 2000 Å is formed, and further thereon, as a lubricative film 13, for instance, a hard carbon film of about 1000 Å thickness is formed. As a result of the above-mentioned configuration, by covering very hard diamond granules 14 with a coating having a wettability, when its surface is slid especially by a flat faced matter the contact area therebetween becomes very small, and therefore, it is effective in providing a surface of small friction coefficient.

Figure 6:
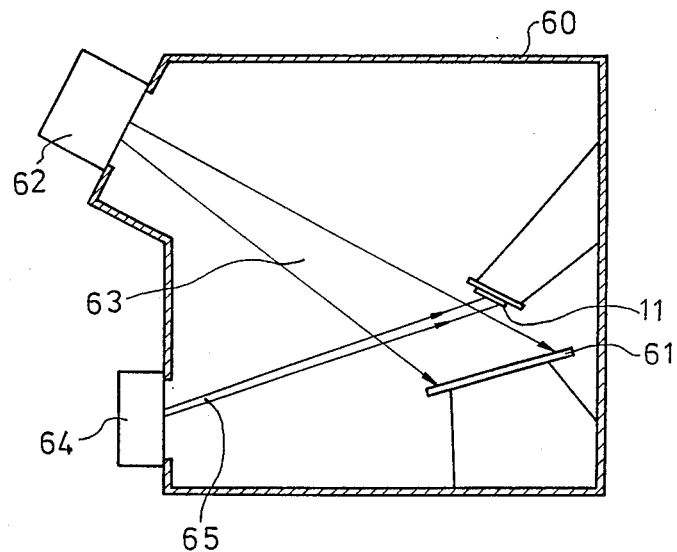
FIG. 6 is a sectional view showing configuration of an ion-beam sputtering apparatus for making the wear-protected device in accordance with the present invention.
Figure 7:
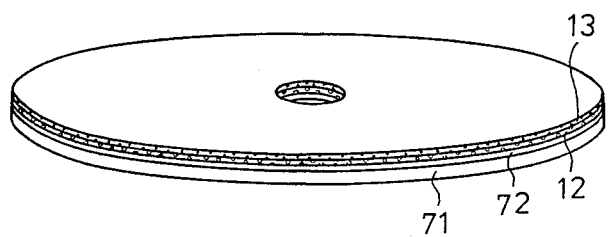
FIG. 7 is a perspective view showing a high density magnetic recording disk wherein the wear-protected film in accordance with the present invention is applied.

A preferred embodiment of a method for making the wear-protected device is elucidated with reference to FIG. 6, which is a sectional view of an apparatus for making the wear-protected device. For instance, in case of making a wear-protected device as shown in FIG. 4, a carbon target 61 in a sputtering chamber 60 is sputtered by an ion-beam of argon gas having ion energy of 1.2 eV and 60 mA generated by an ion-beam source 62. Thereby, a buffer film 31 of about 100 Å thickness is formed on the substrate 11. Thereafter, by gradually increasing hydrogen component in the argon gas in the chamber 60, a buffer film 31 of carbon is completed. The mixing of hydrogen gas in the argon gas is increased gradually up to about 50% of $H_2$ concentration in a manner of five-step-divided injections of the hydrogen the buffer film 31 is formed. Thereafter, with retaining the hydrogen component of 50% a hard carbon film 12 of about 200 Å thickness is formed. In the formation of the hard carbon film, such surface of the substrate of the device that which is to receive physical action by the device after completion is disposed in the chamber 60 substantially parallel to the direction of the ion beam 63. Since the substrate 11 can be retained in a normal temperature in the sputtering, such substrate as plastic sheet, which has relatively low softening point can be used. By irradiating hydrogen ion-beam 65 from another ion-beam source 64 on the substrate 11 during the forming of a hard carbon film 12, a hard carbon film 12 of a greater hardness can be formed. Furthermore, as the inert gas to be used in the ion-beam sputtering process, besides the above-mentioned argon gas, any of the inert gases of krypton, xenon, etc. can be used. Introduction of fluorine ions besides the hydrogen ions is also effective in improving the hardness.

Thereafter, the ion-beam sputtering is made by gradually lowering the partial pressure of the hydrogen gas in the chamber from 50% to 0%, and subsequently thereto, by using only argon gas, the ion-beam sputtering is continued, to form a lubricative film 13 of carbon film up to about 100 Å in thickness.

By Raman spectroscopic analysis it was confirmed that the structures of the lubricative film 13 and the buffer film 31 are of graphite-like carbon and that of the hard carbon film 12 is of diamond-like carbon. The Vickers hardness of the hard carbon film 12 was more than 3000 Kg/□cm².

The graphite-like carbon film appears to be suitable as the buffer film 31 and the lubricative film 13 because of its less hard characteristic than the diamond like carbon, while the diamond-like carbon film appears to be suitable as the hard carbon film 12 because of its hard characteristics.

FIG. 6 shows one example of a high density magnetic disk made by embodying the present invention. In FIG. 6, the size in the vertical direction is shown expanded for clearer illustration. On a disk of a polyester film 71 of about 50 μm thickness, a magnetic film 72 for information storage is formed with Co-Cr alloy of 1 μm by a known process; and further on the surface of the magnetic film 72, a hard carbon film 12 of about 100 Å thickness is formed by the above-mentioned process; and further on the surface of the hard carbon film 12, a lubricative film 13 of about 100 Å thickness is formed by the above-mentioned process. The resultant magnetic data disk can enjoy a very long lifetime in comparison with the conventional magnetic disk wherein the hard carbon film 12 and the lubricative film 13 are not formed; and the formation of the above-mentioned wear-protective layers do not effect the magnetic recording characteristics, but is advantageous in reducing friction between the surface of the magnetic disk and a magnetic head to be applied thereto for information storing or/reading.

What is claimed is:

1. A wear-protected device comprising:
   a substrate to be protected from a physical action thereto, said substrate being made of a material selected from the group consisting of glass, metal, plastic film and resin,
   a hard carbon film formed on said substrate by ion irradiation, said hard carbon film consisting essentially of carbon or carbon and hydrogen, and
   a lubricative film, which has a friction coefficient which is less than 0.3 and smaller than that of said hard carbon film, formed on said hard carbon film.

2. A wear-protected device in accordance with claim 1, wherein
   said lubricative film is made of a substance containing carbon and having a hydrogen component which is smaller than that in said hard carbon film.

3. A wear-protected device in accordance with claim 1, wherein
   said lubricative film is of a substance containing at least one member selected from a group consisting of inorganic metallic compounds of sulfur, inorganic metallic compounds of selenium, inorganic metallic compounds of tellurium, inorganic compounds of halogen, inorganic compounds of nitrogen or graphite.

4. A wear-protected device in accordance with claim 1, wherein
   said lubricative film has a thickness of less than 500 Å.

5. A wear-protected device in accordance with claim 1, wherein
   said lubricative film is of a substance containing at least carbon and hydrogen, component thereof gradually decreasing from a component equal to that of said hard carbon film at the part said lubricative film contacting said hard carbon film to a component of a surface at which said lubricative film receives external physical action.

6. A wear-protected device in accordance with claim 1, wherein
   said hard carbon film is a carbon film containing diamond granules of sizes of less than 1 μm.

7. A wear-protected device in accordance with claim 1, wherein
   said substrate has a rough surface with protrusions or recesses of heights or depths of less than 500 Å.

8. A wear-protected device comprising:
   a substrate to be protected from a physical action thereto, said substrate being made of a material selected from the group consisting of glass, metal, plastic film and resin,
   a buffer film formed on said substrate, said buffer film comprising at least carbon and hydrogen, the distribution of said hydrogen being sloped in concentration, and
   a hard carbon film formed on said buffer film by ion irradiation, said hard carbon film consisting essentially of carbon or carbon and hydrogen.

9. A wear-protected device in accordance with claim 8, wherein
   said buffer film is of a substance containing at least carbon and hydrogen, component thereof is smaller than that in said carbon film.

10. A wear-protected device in accordance with claim 8, wherein
    said hard carbon film has a thickness of less than 500 Å.

11. A wear-protected device in accordance with claim 8, wherein
    said substrate has a softening point of lower than 200° C.

12. A wear-protected device in accordance with claim 8, wherein
    said substrate has a thickness of less that 1 mm.

13. A wear-protected device in accordance with claim 8, wherein:
    the hydrogen in said buffer film increases in concentration towards said hard carbon film.

14. A wear-protected device in accordance with claim 13, wherein:
    the hydrogen in said buffer film increases in concentration towards said hard carbon film.

15. A wear-protected device, comprising:
    a substrate to be protected from a physical action thereto;
    a buffer film layer formed on said substrate;
    a hard carbon film layer formed on said buffer film layer; and
    a hydrogen-containing lubricative film formed on said hard carbon film;
    said buffer film layer comprising at least carbon and hydrogen and having a hydrogen concentration which gradually increases towards said hard carbon film;
    concentration of hydrogen in said lubricative film gradually decreasing from that on an outer surface of said hard carbon film to that on an outer surface of said lubricative film layer.

16. A wear-protected device comprising:
    a substrate to be protected from a physical action thereto, said substrate being made of a material selected from the group consisting of glass, metal, plastic film and resin,
    a buffer film formed on said substrate, said buffer film comprising at least carbon and hydrogen, the distribution of said hydrogen being sloped in concentration,
    a hard carbon film formed on said buffer film by ion irradiation, said hard carbon film consisting essentially of carbon or carbon and hydrogen, and a lubricative film, which has a friction coefficient which is less than 0.3 and less than that of said hard carbon film, said lubricative film being formed on said hard carbon film.

17. A wear-protected structure, comprising:
a substrate having a surface which is to be protected from abrasion, said substrate being made of a material selected from the group consisting of glass, metal, plastic film and resin;
a hard carbon film formed on said surface by ion beam sputtering, said hard carbon film being less than 500 Å in thickness and consisting essentially of carbon or carbon and hydrogen, said hard carbon film having a diamond structure with a Vickers hardness of more than 3000 Kg/cm²; and
a solid state lubricative film formed on an opposite surface of said hard carbon film from said substrate, said lubricative film being less than 500 Å in thickness, having a coefficient of friction on an exposed outer surface thereof which is both less than 0.3 and less than the coefficient of friction of said surface of said hard carbon film; said lubricative film, if containing carbon, containing no more hydrogen by weight percent, than does said hard carbon film; and said lubricative film consisting essentially of at least one constituent selected from the group: graphitic-structure carbon, carbon with up to 50 percent hydrogen, $ZrS_2$, $VS_2$, $MoS_2$, $WS_2$, $PeS_2$, $WSe_2$, $MoSe_3$, $NbSe_2$, a compound of tellurium, a fluorine compound having the general formula $(CF_x)_n$, $CdCl_2$, $CdI_2$, BN and mica.

18. A wear-protected structure comprising:
a substrate having a surface which is to be protected from abrasion, said substrate being made of a material selected from the group consisting of glass, metal, plastic film and resin;
a buffer layer formed on said surface, said buffer layer being less than 500 Å in thickness and consisting essentially of carbon or carbon and hydrogen, said carbon having a graphitic structure; said buffer layer containing no more hydrogen, by weight percent, than does said hard carbon film;
a hard carbon film formed on said buffer layer by ion beam sputtering, said hard carbon film being less than 500 Å in thickness and consisting essentially of carbon or carbon and hydrogen, said hard carbon film having a diamond structure with a Vickers hardness or more than 3000 Kg/cm²; and
a solid state lubricative film formed on an opposite surface of said hard carbon film from said buffer layer, said lubricative film being less than 500 Å in thickness, having a coefficient of friction on an exposed outer surface thereof which is both less than 0.3 and less than the coefficient of friction of said surface of said hard carbon film; said lubricative film, if containing carbon, containing no more hydrogen, by weight percent, than does said hard carbon film; and said lubricative film consisting essentially of at least one constituent selected from the group: graphitic-structure carbon, carbon with up to 50 percent hydrogen, $ZrS_2$, $VS_2$, $MoS_2$, $WS_2$, $PeS_2$, $WSe_2$, $MoSe_3$, $NbSe_2$, a compound of tellurium, a fluorine compound having the general formula $(CF_x)_n$, $CdCl_2$, $CdI_2$, BN and mica.

19. The wear-protected structure of claim 18, wherein:
said lubricative film consists essentially of carbon and hydrogen; and
said buffer layer, said hard carbon film and said lubricative film collectively have a profile of hydrogen content which gradually increases through the thickness of said buffer layer towards said hard carbon layer, remains generally constant through the thickness of said hard carbon layer, and gradually decreases through the thickness of said lubricative film away from said hard carbon layer.

* * * * *